United States Patent
Ichimura et al.

(10) Patent No.: US 10,410,859 B2
(45) Date of Patent: Sep. 10, 2019

(54) EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

(71) Applicant: NGK INSULATORS, LTD., Nagoya-shi, Aichi (JP)

(72) Inventors: Mikiya Ichimura, Ichinomiya (JP); Sota Maehara, Nagoya (JP); Yoshitaka Kuraoka, Okazaki (JP)

(73) Assignee: NGK INSULATORS, LTD., Nagoya-shi, Aichi (JP)

( * ) Notice: Subject to any disclaimer, the term of this patent is extended or adjusted under 35 U.S.C. 154(b) by 0 days.

(21) Appl. No.: 15/965,014

(22) Filed: Apr. 27, 2018

(65) Prior Publication Data

US 2018/0247809 A1 Aug. 30, 2018
US 2019/0027359 A9 Jan. 24, 2019

Related U.S. Application Data

(63) Continuation of application No. PCT/JP2016/079619, filed on Oct. 5, 2016.
(Continued)

(30) Foreign Application Priority Data

Jan. 14, 2016 (JP) .................................. 2016-005164

(51) Int. Cl.
*H01L 21/02* (2006.01)
*C23C 16/34* (2006.01)
(Continued)

(52) U.S. Cl.
CPC ...... *H01L 21/02389* (2013.01); *C23C 16/303* (2013.01); *C23C 16/34* (2013.01);
(Continued)

(58) Field of Classification Search
None
See application file for complete search history.

(56) References Cited

U.S. PATENT DOCUMENTS 9,054,167 B2 6/2015 Saunier
2009/0189190 A1 7/2009 Hashimoto et al.
(Continued)

FOREIGN PATENT DOCUMENTS

JP 2006-332367 A 12/2006
JP 2011-068548 A 4/2011
(Continued)

OTHER PUBLICATIONS

International Search Reports for PCT/JP2016/079619, PCT/JP2016/082370 and PCT/JP2016/082367 (4 pgs).
(Continued)

*Primary Examiner* — Michelle Mandala
(74) *Attorney, Agent, or Firm* — Flynn Thiel, P.C.

(57) ABSTRACT

An epitaxial substrate for semiconductor elements which suppresses the occurrence of current collapse. The epitaxial substrate for the semiconductor elements includes: a semi-insulating free-standing substrate formed of GaN doped with Zn; a buffer layer adjacent to the free-standing substrate; a channel layer adjacent to the buffer layer; and a barrier layer provided on an opposite side of the buffer layer with the channel layer provided therebetween, wherein the buffer layer is a diffusion suppressing layer that suppresses the diffusion of Zn from the free-standing substrate into the channel layer.

20 Claims, 7 Drawing Sheets

Related U.S. Application Data

(60) Provisional application No. 62/249,565, filed on Nov. 2, 2015.

(51) Int. Cl.
| | |
|---|---|
| *H01L 29/778* | (2006.01) |
| *H01L 29/20* | (2006.01) |
| *H01L 29/201* | (2006.01) |
| *H01L 21/205* | (2006.01) |
| *H01L 29/40* | (2006.01) |
| *H01L 29/66* | (2006.01) |
| *H01L 29/812* | (2006.01) |
| *C30B 19/02* | (2006.01) |
| *C30B 29/40* | (2006.01) |
| *H01L 29/205* | (2006.01) |
| *C23C 16/30* | (2006.01) |
| *H01L 29/207* | (2006.01) |

(52) U.S. Cl.
CPC ............ *C30B 19/02* (2013.01); *C30B 29/406* (2013.01); *H01L 21/0251* (2013.01); *H01L 21/0254* (2013.01); *H01L 21/0262* (2013.01); *H01L 21/02458* (2013.01); *H01L 21/205* (2013.01); *H01L 29/201* (2013.01); *H01L 29/2003* (2013.01); *H01L 29/205* (2013.01); *H01L 29/401* (2013.01); *H01L 29/66007* (2013.01); *H01L 29/66462* (2013.01); *H01L 29/778* (2013.01); *H01L 29/7786* (2013.01); *H01L 29/7787* (2013.01); *H01L 29/812* (2013.01); *H01L 29/207* (2013.01)

(56) References Cited

U.S. PATENT DOCUMENTS

| | | | | |
|---|---|---|---|---|
| 2010/0230723 | A1 | 9/2010 | Hashimoto et al. | |
| 2013/0075786 | A1 | 3/2013 | Ishiguro | |
| 2013/0105817 | A1 | 5/2013 | Saunier | |
| 2013/0307022 | A1* | 11/2013 | Mitsunaga ............ | H01L 29/778 257/190 |
| 2015/0069407 | A1* | 3/2015 | Matsubayashi ... | H01L 29/66462 257/76 |
| 2015/0311290 | A1* | 10/2015 | Kang ................ | H01L 21/02378 257/77 |

FOREIGN PATENT DOCUMENTS

| | | |
|---|---|---|
| JP | 2011-187643 A | 9/2011 |
| JP | 2013/074211 A | 4/2013 |
| JP | 2013-118360 A | 6/2013 |
| JP | 2014-027187 A | 2/2014 |

OTHER PUBLICATIONS

*AlGaN/GaN Heterostructure Field-Effect Transistors on Fe-Doped GaN Substrates with High Breakdown Voltage*, by Y. Oshimura et al, Japanese Journal of Applied Physics, vol. 50, 2011, pp. 084102-1 through 084102-5 (5 pgs).

*Comparison of the DC and Microwave Performance of AlGaN/GaN HEMTs Grown on SiC by MOCVD with Fe-Doped or Unintentionally Doped GaN Buffer Layers*, by V. Desmaris et al, IEEE Transactions on Electron Devices, vol. 53, No. 9, 2006, pp. 2413-2417 (5 pgs).

*Inhibition of interface pollution in AlGaN/GaN HEMT structures regrown on semi-insulating GaN templates*, by M. Azize et al, Elsevier, Journal of Crystal Growth, vol. 299, 2007, pp. 103-108 (6 pgs).

*Optical activation and diffusivity of ion-implanted Zn acceptors in GaN under high-pressure, high-temperature annealing*, by T. Suski et al, Journal of Applied Physics, vol. 84, No. 2, 1998, pp. 1155-1157 (3 pgs).

International Preliminary Report on Patentability for PCT/JP2016/079619, dated May 8, 2018 (1 page).

English translation of Written Opinion of the International Searching Authority for PCT/JP2016/079619, dated Dec. 27, 2016 (5 pages).

International Preliminary Report on Patentability for PCT/JP2016/082370, dated May 8, 2018 (1 page).

English translation of Written Opinion of the International Searching Authority for PCT/JP2016/082370, dated Jan. 24, 2017 (4 pages).

International Preliminary Report on Patentability for PCT/JP2016/082367, dated May 8, 2018 (1 page).

English translation of Written Opinion of the International Searching Authority for PCT/JP2016/082367, dated Jan. 24, 2017 (4 pages).

* cited by examiner

F I G . 4
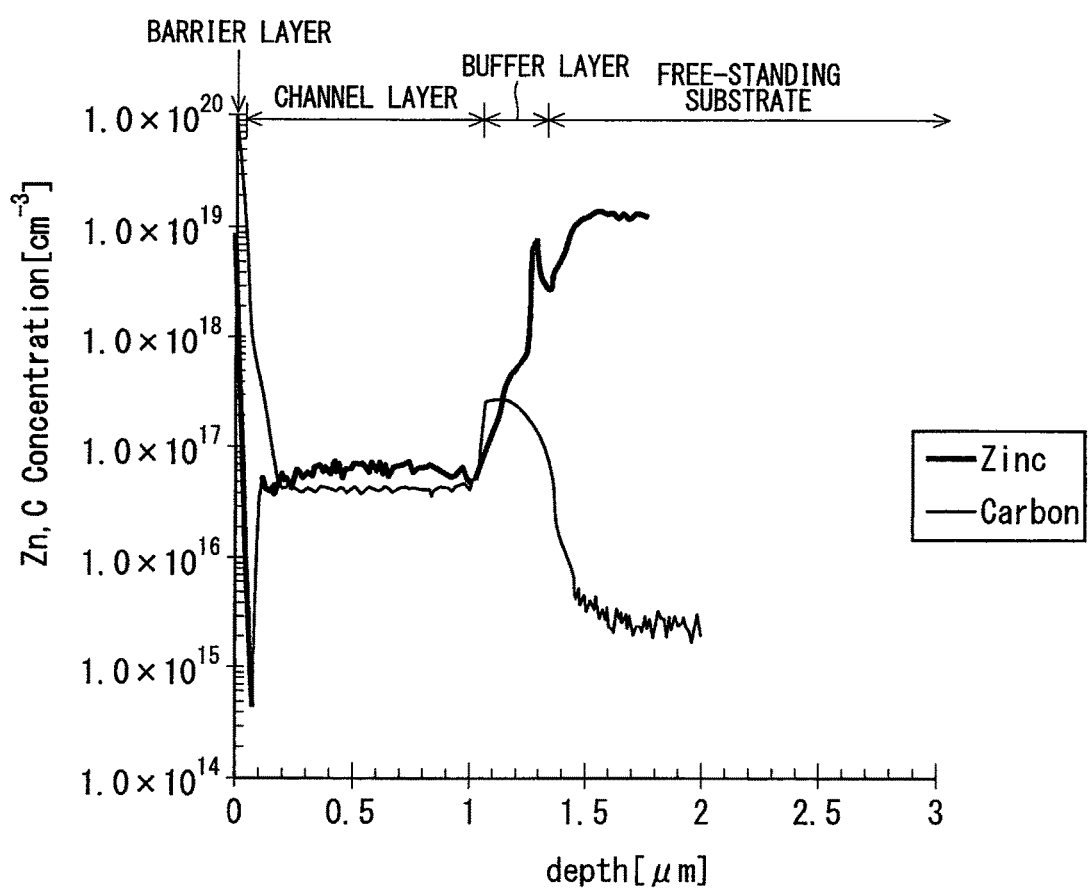

F I G . 5
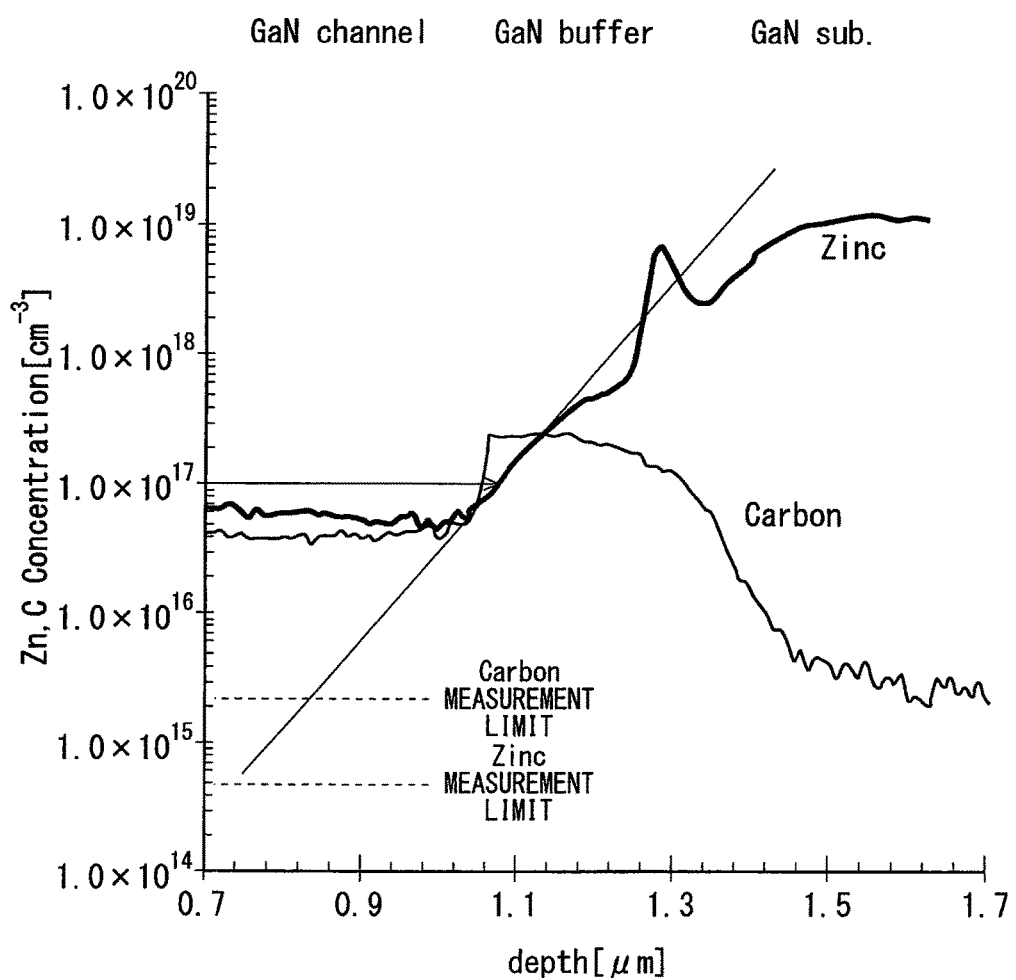

F I G. 6
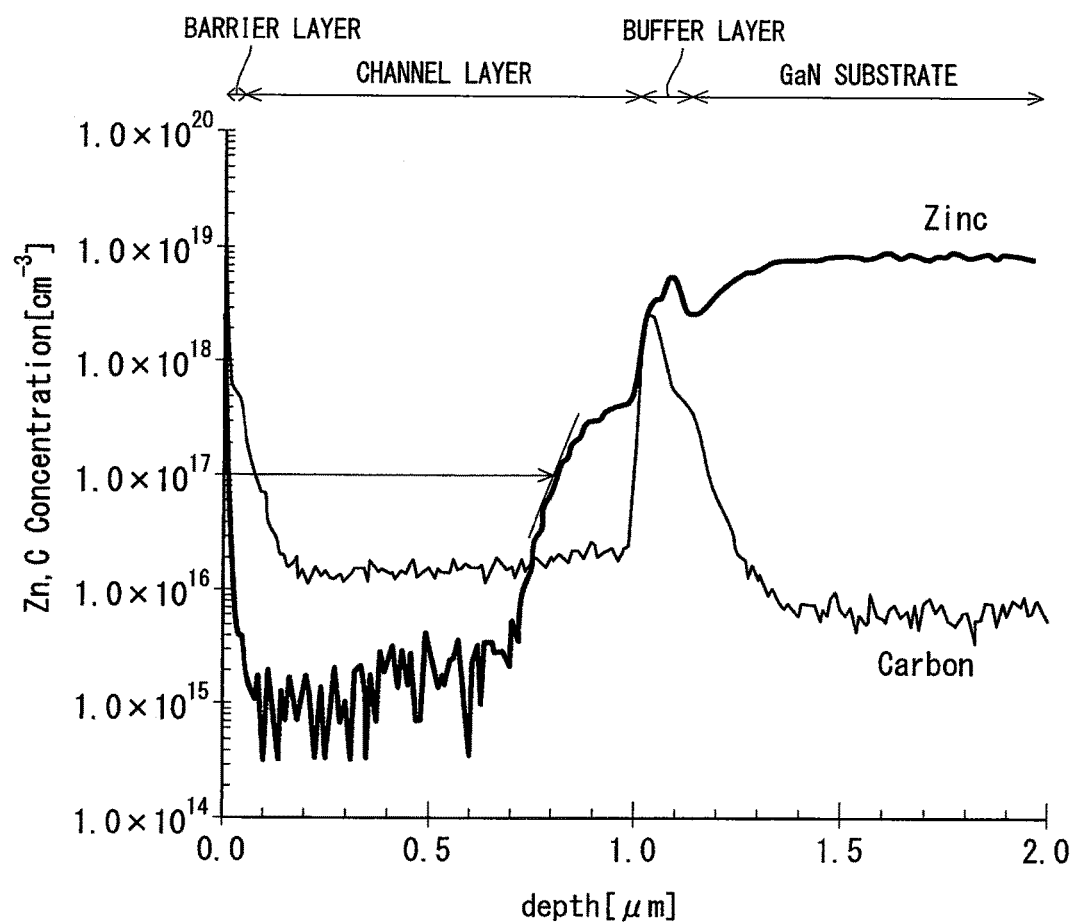

EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

CROSS-REFERENCE TO RELATED APPLICATIONS

This is a continuation of International Application No. PCT/JP2016/079619, filed Oct. 5, 2016, which claims the benefit of U.S. Provisional Application No. 62/249,565, filed Nov. 2, 2015 and Japanese Application No. 2016-005164, filed Jan. 14, 2016, all of which are hereby incorporated by reference herein in their entirety.

TECHNICAL FIELD

The present invention relates to a semiconductor element, and particularly to a semiconductor element constituted by using a free-standing substrate that is made of semi-insulating GaN.

BACKGROUND ART

Nitride semiconductors, which have direct-transition-type wide band gap, high breakdown electric field, and high saturation electron velocity, have been used as light emission devices such as LED or LD and semiconductor materials for high-frequency/high-power electronic devices.

Typical structures of the nitride electronic devices include a high electron mobility transistor (HEMT) structure which is formed by laminating AlGaN as "a barrier layer" and GaN as "a channel layer". This structure utilizes a feature that a high concentration two-dimensional electron gas is generated at an AlGaN/GaN lamination interface owing to large polarization effects (spontaneous polarization effect and piezo polarization effect) inherent in nitride materials.

The nitride electronic devices are generally manufactured using different material base substrates such as sapphire, SiC, and Si which are easily available in a commercial way. However, there arises a problem that large numbers of defects occur in a GaN film which is heteroepitaxially grown on the different material substrates due to a difference in lattice constants and heat expansion coefficients between GaN and the different material substrates.

In the meanwhile, when the GaN film is homoepitaxially grown on a GaN substrate, the defect caused by the difference in lattice constants and heat expansion coefficients described above does not occur, but the GaN film shows a favorable crystalline nature.

Accordingly, when the nitride HEMT structure is manufactured on the GaN substrate, mobility of the two-dimensional electron gas at the AlGaN/GaN lamination interface is enhanced, thus a characteristic improvement of an HEMT element (semiconductor element) manufactured using the above structure can be expected.

However, the GaN substrate manufactured by a hydride vapor phase epitaxial growth method (HVPE method), which can be commercially available, generally has an n-type conductivity due to an oxygen impurity incorporated into a crystal. The conductive GaN substrate serves as a leakage current pathway between source-drain electrodes when the HEMT element is driven at a high voltage. Thus, it is preferable to use the semi-insulating GaN substrate to manufacture the HEMT element.

It is known to be efficient to perform doping of an element such as a transition metal element (Fe, for example) or group 2 element (Mg, for example) which forms a deep acceptor level in the GaN crystal to achieve the semi-insulating GaN substrate.

It is already known that when elemental zinc (Zn) is adopted from group 2 elements, a high-quality semi-insulating GaN single-crystal substrate can be achieved (for example, refer to Patent Document 1). An investigation has been already performed on the diffusion of the elemental Zn in the GaN crystal, and the diffusion occurs in a high temperature atmosphere and ease of diffusion depends on crystallinity of the GaN crystal (for example, refer to Non-Patent Document 4.) Also known is an aspect that when a high-resistance layer doped with iron (Fe), which is a transition metal element, is formed on a substrate, and an intermediate layer having a high effect of incorporating Fe is further formed between the high-resistance layer and an electron transit layer, Fe is prevented from being incorporated into the electron transit layer (for example, refer to Patent Document 2).

A manufacture of the HEMT structure on the semi-insulating GaN substrate or a substrate with the semi-insulating GaN film to evaluate each characteristic has been already performed (for example, refer to Non-Patent Document 1 to Non-Patent Document 3).

When the GaN film is epitaxially grown on the semi-insulating GaN single crystal substrate, which is doped with the transition metal element or the group 2 element, to form an epitaxial substrate for the semiconductor elements, there arises a problem that an acceptor element such as Fe, Mg, and Zn is diffused in the GaN film and acts as an electron trap in the film, thus causing a current collapse phenomenon.

PRIOR ART DOCUMENTS

Patent Documents

Patent Document 1: Japanese Patent No. 5039813
Patent Document 2: Japanese Patent Application Laid-Open No. 2013-74211

Non-Patent Documents

Non-Patent Document 1: Yoshinori Oshimura, Takayuki Sugiyama, Kenichiro Takeda, Motoaki Iwaya, Tetsuya Takeuchi, Satoshi Kamiyama, Isamu Akasaki, and Hiroshi Amano, "AlGaN/GaN Heterostructure Field-Effect Transistors on Fe-Doped GaN Substrates with High Breakdown Voltage", Japanese Journal of Applied Physics, vol. 50 (2011), p. 084102-1-p. 084102-5.
Non-Patent Document 2: V. Desmaris, M. Rudzinski, N. Rorsman, P. R. Hageman, P. K. Larsen, H. Zirath, T. C. Rodle, and H. F. F. Jos, "Comparison of the DC and Microwave Performance of AlGaN/GaN HEMTs Grown on SiC by MOCVD With Fe-Doped or Unintentionally Doped GaN Buffer Layers", IEEE Transactions on Electron Devices, Vol. 53, No. 9, pp. 2413-2417, September 2006.
Non-Patent Document 3: M. Azize, Z. Bougrioua, and P. Gibart, "Inhibition of interface pollution in AlGaN/GaN HEMT structures regrown on semi-insulating GaN templates", Journal of Crystal Growth, vol. 299 (2007), p. 103-p. 108.
Non-Patent Document 4: T. Suzuki, J. Jun, M. Leszczynski, H. Teisseyre, S. Strite, A. Rockett, A. Pelzmann, M. Camp, and K. J. Ebeling, "Optical activation and diffusivity of ion-implanted Zn acceptors in GaN under high-pressure, high-temperature annealing", Journal of Applied Physics, Vol. 84 (1998), No. 2, pp. 1155-1157.

SUMMARY

The present invention relates to a semiconductor element, and particularly to a semiconductor element constituted by using a free-standing substrate formed of semi-insulating GaN.

According to the present invention, an epitaxial substrate for semiconductor elements includes: a semi-insulating free-standing substrate formed of GaN doped with Zn; a buffer layer adjacent to the free-standing substrate and being a group 13 nitride layer that is doped with C at a concentration equal to or higher than $1\times10^{18}$ cm$^{-3}$ in at least part of said buffer layer in a thickness direction; a channel layer adjacent to the buffer layer; and a barrier layer provided on an opposite side of the buffer layer with the channel layer provided therebetween, wherein the buffer layer is a diffusion suppressing layer that suppresses the diffusion of Zn from the free-standing substrate into the channel layer, and a concentration of Zn in said channel layer is equal to or lower than $1\times10^{16}$ cm$^{-3}$.

According to another aspect of the present invention, a semiconductor element includes: a semi-insulating free-standing substrate formed of GaN doped with Zn; a buffer layer adjacent to the free-standing substrate and being a group 13 nitride layer that is doped with C at a concentration equal to or higher than $1\times10^{18}$ cm$^{-3}$ in at least part of said buffer layer in a thickness direction; a channel layer adjacent to the buffer layer; and a barrier layer provided on an opposite side of the buffer layer with the channel layer provided therebetween, wherein the buffer layer is a diffusion suppressing layer that suppresses the diffusion of Zn from the free-standing substrate into the channel layer, and a concentration of Zn in said channel layer is equal to or lower than $1\times10^{16}$ cm$^{-3}$.

According to still another aspect of the present invention, a method of manufacturing an epitaxial substrate for semiconductor elements includes: a) a preparation step of preparing a semi-insulating free-standing substrate that is made of GaN doped with Zn; b) a buffer layer formation step of forming a buffer layer adjacent to the free-standing substrate; c) a channel layer formation step of forming a channel layer adjacent to the buffer layer; and d) a barrier layer formation step of forming a barrier layer in a position opposite to the buffer layer with the channel layer provided therebetween, wherein in the buffer layer formation step, the buffer layer is formed as a diffusion suppressing layer, which is a group 13 nitride layer that is doped with C at a concentration equal to or higher than $1\times10^{18}$ cm$^{-3}$ in at least part of said buffer layer in a thickness direction, that suppresses diffusion of Zn from the free-standing substrate into the channel layer, so that a concentration of Zn in said channel layer is equal to or lower than $1\times10^{16}$ cm$^{-3}$.

According to the present invention, a semiconductor element in which the current collapse is reduced while using a semi-insulating GaN free-standing substrate can be achieved.

Thus, it is an object of the present invention to provide an epitaxial substrate for semiconductor elements which suppresses an occurrence of current collapse.

BRIEF DESCRIPTION OF DRAWINGS

FIG. 4 is a drawing illustrating a concentration profile of elemental Zn and elemental C in an epitaxial substrate according to a Comparative Example 1.

FIG. 5 is an enlarged view in a neighborhood of an interface between a C-doped GaN buffer layer and a GaN substrate in FIG. 4.

FIG. 6 is a drawing illustrating a concentration profile of elemental Zn and elemental C from a surface of a barrier layer 4 in a depth direction in an Example 7.

DESCRIPTION OF EMBODIMENT(S)

Group numbers of a periodic table in the present specification are according to the explanation of group numbers 1 to 18 in the nomenclature of inorganic chemistry revised in 1989 by the international union of pure applied chemistry (IUPAC). Group 13 refers to, for example, aluminum (Al), gallium (Ga), and indium (In), group 14 refers to, for example, silicon (Si), germanium (Ge), tin (Sn), and lead (Pb), and group 15 refers to, for example, nitrogen (N), phosphorous (P), arsenic (As), and antimony (Sb).

<Summary of Epitaxial Substrate and HEMT Element>

Figure 1:
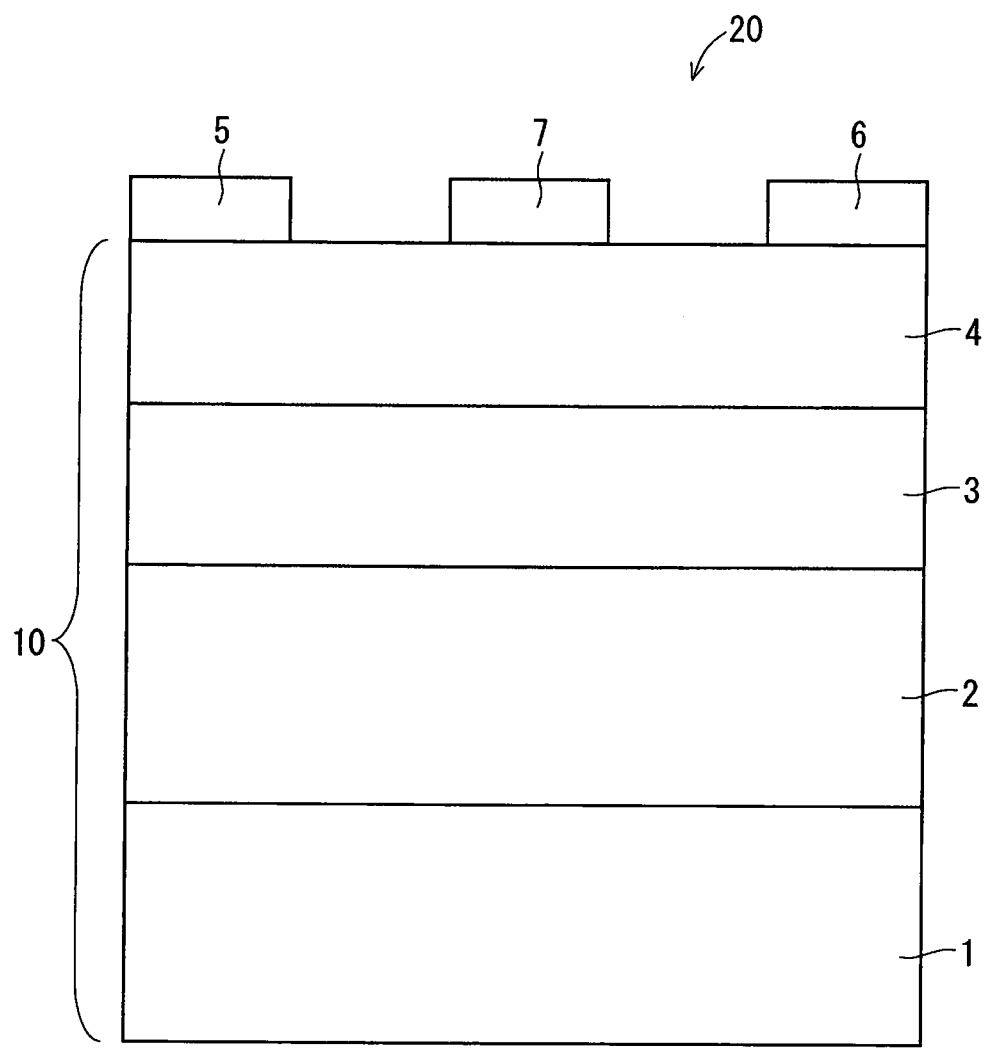
FIG. 1 is a drawing schematically illustrating a cross-sectional structure of an HEMT element 20.

FIG. 1 is a drawing schematically illustrating a cross-sectional structure of an HEMT element 20 as one embodiment of a semiconductor element according to the present invention, which includes an epitaxial substrate 10 as one embodiment of an epitaxial substrate for semiconductor elements according to the present invention.

The epitaxial substrate 10 includes a free-standing substrate 1, a buffer layer 2, a channel layer 3, and a barrier layer 4. The HEMT device 20 comprises a source electrode 5, a drain electrode 6, and a gate electrode 7 disposed on the epitaxial substrate 10 (on the barrier layer 4). The ratios of the respective layers in FIG. 1 do not reflect the actual ones.

The free-standing substrate 1 is a GaN substrate which is doped with $1\times10^{18}$ cm$^{-3}$ or more of Zn and has a (0001) plane orientation, and has a resistivity of $1\times10^{2}$ Ωcm or more at room temperature and has semi-insulating properties. Although the size of the free-standing substrate 1 is not particularly limited, the free-standing substrate 1 preferably has a thickness of approximately several hundreds of μm to several mm in consideration of, for example, ease of handling (grasping and movement, for example). The free-standing substrate 1 can be manufactured by a flux method, for example.

The free-standing substrate 1 formed by the flux method is obtained by the following processes briefly of: immersing a seed substrate in a melt containing metal Ga, metal Na, metal Zn, and C (carbon) in a growing vessel (alumina crucible) disposed to be horizontally rotatable in a pressure vessel; keeping a predetermined temperature and a predetermined pressure in the growing vessel with the introduction of nitrogen gas, while horizontally rotating the growing vessel; and then separating a GaN single crystal, which is resultantly formed on the seed substrate from the seed substrate. A so-called template substrate in which a GaN thin film is formed on a sapphire substrate by a MOCVD method can be preferably used as the seed substrate.

The buffer layer 2 is a layer having a thickness of approximately 50 to 1000 nm, (adjacently) formed on one main surface of the free-standing substrate 1. In the present embodiment, the buffer layer 2 is formed at a temperature substantially the same as the formation temperature of the channel layer 3 and the barrier layer 4, differing from a so-called low-temperature buffer layer formed at a low temperature lower than 800° C.

In the epitaxial substrate 10 according to the present embodiment, the buffer layer 2 is provided as a diffusion suppressing layer to suppress the diffusion of Zn, with which the free-standing substrate 1 is doped, into the channel layer 3 and further into the barrier layer 4 on the channel layer 3 at a time of manufacturing the epitaxial substrate 10. The buffer layer 2, as a preferred example, is constituted by a layer formed of a group 13 nitride containing C doped at a concentration of $1\times10^{18}$ cm$^{-3}$ or more in at least a part of a range in the thickness direction.

In the above case, the buffer layer 2 may be a single layer, which is wholly formed of the group 13 nitride containing C doped at the concentration of $1\times10^{18}$ cm$^{-3}$ or more, or may have a configuration that at least one layer of a multi-layered buffer layer, which is formed of two or more group 13 nitride layers having different compositions, contains the doped C at the concentration of $1\times10^{18}$ cm$^{-3}$ or more. Examples of the single layer include, for example, a GaN buffer layer (C-doped GaN layer) which is wholly made of GaN. Examples of the multi-layered buffer layer include, for example, a configuration that a C-doped GaN layer is laminated on a $Al_aGa_{1-a}N$ layer (0<a≤1). Alternatively, the buffer layer 2 may be provided by doping C at the concentration of $1\times10^{18}$ cm$^{-3}$ or more in a range of at least a part of a composition gradient buffer layer, in the thickness direction, which is formed of group 13 nitrides containing two or more group 13 elements (for example, Ga and Al), each element having an existence ratio (mole fraction) changed in the thickness direction. An effect brought about by the buffer layer 2 is described hereinafter.

Also applicable is an aspect that the buffer layer 2 is constituted by a layer formed of an Al-doped GaN (Al-doped GaN layer) or a layer made of AlN. Each of these layers also functions as a diffusion suppressing layer in a manner similar to the C-doped GaN layer.

The channel layer 3 is a layer (adjacently) formed on the buffer layer 2. The channel layer 3 is formed to have a thickness of approximately 50 to 5000 nm. The barrier layer 4 is a layer provided on an opposite side of the buffer layer 2 with the channel layer 3 provided therebetween. The barrier layer 4 is formed to have a thickness of approximately 2 to 40 nm.

The barrier layer 4 may be formed adjacent to the channel layer 3 as illustrated in FIG. 1, and in this case, an interface therebetween is a heterojunction interface. Alternatively, a spacer layer not shown may be provided between the channel layer 3 and the barrier layer 4, and in this case, a region from an interface between the channel layer 3 and the spacer layer and an interface between the barrier layer 4 and the spacer layer is a heterojunction interface region.

In any case, as a preferred example, the channel layer 3 is made of GaN, and the barrier layer 4 is made of AlGaN ($Al_xGa_{1-x}N$, 0<x<1) or InAlN ($In_yAl_{1-y}N$, 0<y<1). However, a combination of the channel layer 3 and the barrier layer 4 is not limited thereto.

The formation of the buffer layer 2, the channel layer 3, and the barrier layer 4 is achieved by the MOCVD method, for example. In a case where the buffer layer 2 and the channel layer 3 are formed of GaN and the barrier layer 4 is formed of AlGaN, for example, the layer formation by the MOCVD method can be performed, using a publicly known MOCVD furnace capable of supplying an organic metal (MO) source gas for Ga and Al (TMG and TMA), ammonia gas, hydrogen gas, and nitrogen gas into a reactor, by heating the free-standing substrate 1 disposed in the reactor to a predetermined temperature and depositing a GaN crystal and an AlGaN crystal generated by a gas phase reaction between the organic metal source gas corresponding to each layer and the ammonia gas on the free-standing substrate 1 in sequence.

The source electrode 5 and the drain electrode 6 are metal electrodes each having a thickness of approximately ten and several nm to a hundred and several tens of nm. The source electrode 5 and the drain electrode 6 are preferably formed as multi-layered electrodes of, for example, Ti/Al/Ni/Au. The source electrode 5 and the drain electrode 6 have ohmic contact with the barrier layer 4. The source electrode 5 and the drain electrode 6, as a preferred example, are formed by a vacuum evaporation method and a photolithography process. It is preferable to perform a thermal treatment for several tens of seconds in a nitrogen gas atmosphere at a predetermined temperature of 650 to 1000° C. after forming the electrodes 5 and 6 to enhance the ohmic contact of those electrodes.

The gate electrode 7 is a metal electrode having a thickness of approximately ten and several nm to a hundred and several tens of nm. The gate electrode 7 is preferably formed as a multi-layered electrode of, for example, Ni/Au. The gate electrode 7 has Schottky contact with the barrier layer 4. The gate electrode 7, as a preferred example, is formed by a vacuum evaporation method and a photolithography process.

<Method of Manufacturing Epitaxial Substrate and HEMT Element>

(Manufacture of Free-Standing Substrate)

A procedure of manufacturing the free-standing substrate 1 by the flux method is firstly described.

Firstly, a c-plane sapphire substrate having a diameter substantially the same as that of the free-standing substrate 1 to be manufactured is prepared, and a GaN low-temperature buffer layer is formed on a surface of the c-plane sapphire substrate to have a thickness of approximately 10 to 50 nm at a temperature of 450 to 750° C. Subsequently, a GaN thin film having a thickness of approximately 1 to 10 μm is formed by the MOCVD method at a temperature of 1000 to 1200° C., thereby obtaining a MOCVD-GaN template usable as a seed substrate.

Next, a Zn-doped GaN single crystal layer is formed by a Na flux method using the MOCVD-GaN template which has been obtained as the seed substrate.

Specifically, the MOCVD-GaN template is firstly disposed in an alumina crucible, and subsequently, the alumina crucible is filled with 10 to 60 g of metal Ga, 15 to 90 g of metal Na, 0.1 to 5 g of metal Zn, and 10 to 500 mg of C.

The alumina crucible is put in a heating furnace and heated for approximately 20 to 400 hours with a furnace temperature of 800 to 950° C. and a furnace pressure of 3 to 5 MPa, and subsequently cooled to room temperature. After finishing cooling, the alumina crucible is taken out of the furnace. As a result of the above procedure, a brown GaN single crystal layer with a thickness of 300 to 3000 μm is deposited on the surface of the MOCVD-GaN template.

The GaN single crystal layer which has been obtained in such a manner is ground with diamond abrasive grains to planarize a surface thereof. The Flux-GaN template having the GaN single crystal layer formed on the MOCVD-GaN template is thereby obtained. However, the grinding is performed to the extent that a total thickness of a nitride layer on the Flux-GaN template is sufficiently kept larger than a targeted thickness of the free-standing substrate 1 to be obtained eventually.

Subsequently, by a laser lift-off method in which laser light is emitted from a side of the seed substrate to perform scanning at a scan speed of 0.1 to 100 mm/sec., the seed substrate is separated from the Flux-GaN template. Third harmonic of Nd: YAG having a wavelength of 355 nm, for example, is preferably used as the laser light. In the above case, a pulse width may be set to approximately 1 to 1000 ns and a pulse period may be set to approximately 1 to 200 kHz. In emitting the laser light, it is preferable to appropriately collect the laser light to adjust the light density. It is preferable to emit the laser light while heating the Flux-GaN template from a side opposite to the seed substrate at a temperature of approximately 30 to 600° C.

After separating the seed substrate, a grinding processing is performed on a surface, from which the seed substrate has been detached, of a laminated structure which has been obtained. The free-standing substrate 1 formed of GaN containing Zn doped at a concentration of $1\times10^{18}$ cm$^{-3}$ or more is thereby obtained.

(Manufacture of Epitaxial Substrate)

Subsequently, the manufacture of the epitaxial substrate 10 by the MOCVD method is described. The epitaxial substrate 10 is obtained by laminating the buffer layer 2, the channel layer 3, and the barrier layer 4 in this order under the following conditions in a state where the free-standing substrate 1 is disposed on a susceptor provided in the reactor in the MOCVD furnace. However, described as an example of the buffer layer 2 is a case where a single GaN buffer layer or a multi-layered buffer layer or a composition gradient buffer layer containing Ga and Al as group 13 element is formed. The formation temperature means a susceptor heating temperature.

In the present embodiment, the gas ratio of group 15 to group 13 is the ratio (molar ratio) of a supply amount of ammonia, which is a group 15 (N) source, to a total supply amount of trimethylgallium (TMG), trimethylaluminum (TMA), and trimethylindium (TMI), which are group 13 (Ga, Al, and In) sources. The gas ratio of an Al source gas to a group 13 source gas in a case of making the barrier layer 4 of AlGaN is a ratio (molar ratio) of a supply amount of an Al source to a supply amount of whole group 13 (Ga, Al) sources, and the gas ratio of an In source gas to a group 13 source gas in the case of making the barrier layer 4 of InAlN is a ratio (molar ratio) of a supply amount of an In source to a supply amount of whole group 13 (In, Al) sources. Both are defined in accordance with a composition (an Al molar ratio x or an In composition ratio y) of a desired barrier layer 4.

Buffer layer 2:
Formation temperature=900 to 1100° C.;
Reactor pressure=5 to 30 kPa;
Carrier gas=hydrogen;
Gas ratio of group 15 to group 13=100 to 4000;
Gas ratio of Al source gas to group 13 source gas=0 (in a case of the GaN buffer layer);
Gas ratio of Al source gas to group 13 source gas=ranging from 0 to 1 in accordance with a position in the thickness direction (in a case of the multi-layered buffer layer or the composition gradient buffer layer).
Channel layer 3:
Formation temperature=1000 to 1200° C.;
Reactor pressure=15 to 105 kPa;
Carrier gas=hydrogen;
Gas ratio of group 15 to group 13=1000 to 10000.
Barrier layer 4 (in a case of being made of AlGaN):
Formation temperature=1000 to 1200° C.;
Reactor pressure=1 to 30 kPa;
Gas ratio of group 15 to group 13=5000 to 20000;
Carrier gas=hydrogen;
Gas ratio of Al source gas to group 13 source gas=0.1 to 0.4.
Barrier layer 4 (in a case of being made of InAlN):
Formation temperature=700 to 900° C.;
Reactor pressure=1 to 30 kPa;
Gas ratio of group 15 to group 13=2000 to 20000;
Carrier gas=nitrogen;
Gas ratio of In source gas to group 13 source gas=0.1 to 0.9.

(Manufacture of HEMT Element)

The HEMT element 20 using the epitaxial substrate 10 can be manufactured by applying a publicly known technique.

For example, after an element separation processing of removing a portion of a boundary between individual elements by performing etching to approximately 50 to 1000 nm, using a photolithography process and a RIE (reactive ion etching) method, an SiO$_2$ film having a thickness of 50 to 500 nm is formed on a surface of the epitaxial substrate 10 (the surface of the barrier layer 4), and then the SiO$_2$ film at locations where the source electrode 5 and the drain electrode 6 are to be formed is removed by etching using the photolithography process, thereby obtaining an SiO$_2$ pattern layer.

Next, a metal pattern of Ti/Al/Ni/Au is formed at the locations where the source electrode 5 and the drain electrode 6 are to be formed by the vacuum deposition method and the photolithography process, thereby forming the source electrode 5 and the drain electrode 6. The metal layers preferably have thicknesses of 5 to 50 nm, 40 to 400 nm, 4 to 40 nm, and 20 to 200 nm in this order, respectively.

Subsequently, a thermal treatment is performed for 10 to 1000 seconds in nitrogen gas atmosphere at a temperature of 600 to 1000° C. to improve the ohmic contact of the source electrode 5 and the drain electrode 6.

Then, the SiO$_2$ film at locations where the gate electrode 7 is to be formed is removed from the SiO$_2$ pattern layer using the photolithography process.

Furthermore, a Schottky metal pattern of Ni/Au is formed at the locations where the gate electrode 7 is to be formed by the vacuum deposition method and the photolithography process, thereby forming the gate electrode 7. The metal layers preferably have thicknesses of 4 to 40 nm and 20 to 200 nm, respectively.

The HEMT element 20 is obtained by the processes described above.

(Effect of Buffer Layer)

As described above, in the HEMT element 20 according to the present embodiment, the free-standing substrate 1 is formed of GaN containing Zn doped at the concentration of $1\times10^{18}$ cm$^{-3}$ or more, and the buffer layer 2 is provided to function as the diffusion suppressing layer to suppress the diffusion of Zn from the free-standing substrate 1 into the channel layer 3 at the time of manufacturing the epitaxial substrate 10. Illustrated as an example of the buffer layer 2 is a layer formed of a group 13 nitride containing C doped at the concentration of $1\times10^{18}$ cm$^{-3}$ or more in at least the part of the range in the thickness direction.

If the buffer layer 2 is not doped with C under the concentration condition described above, Zn is diffused from the buffer layer 2 into the channel layer 3 and further into the barrier layer 4. In the above case, since Zn functioning as the acceptor element acts as an electric trap, a current collapse phenomenon occurs in the HEMT element 20.

However, in the HEMT element 20 according to the present embodiment, the occurrence of current collapse is preferably suppressed as a result of preferably suppressing the diffusion of Zn from the free-standing substrate 1 by making the buffer layer 2 of the group 13 nitride layer containing C doped under the concentration condition described above. More specifically, when the concentration of Zn in the channel layer was $1 \times 10^{16}$ cm$^{-3}$ or less, the occurrence of current collapse was preferably suppressed in the HEMT element 20.

The doping of C at the concentration of $1 \times 10^{18}$ cm$^{-3}$ or more in at least part of the buffer layer 2 in the thickness direction is based on a fact that the concentration of C can be changed by appropriately adjusting a formation condition of the group 13 nitride layer such as the growth temperature, the reactor pressure, the gas ratio of group 15 to group 13, and the formation thickness, for example, at the time of forming the group 13 nitride layer by the MOCVD method. C with which the crystal layer formed by the MOCVD method is doped is mainly derived from the group 13 source, and for example, the supply amount of C changes with the supply amount of group 13 gas, and the stability of the C element in the group 13 nitride crystal is influenced by the temperature and pressure.

Thus, when the HEMT element 20 according to the present embodiment is obtained, used in the formation of the buffer layer 2 is the growth condition that the doping of C at the concentration of $1 \times 10^{18}$ cm$^{-3}$ or more is performed in at least the part of the range in the thickness direction, and used in the formation of the channel layer 3 is the growth condition that such doping is not performed, for example, the growth condition that the concentration of C in the channel layer 3 is lower than that of the buffer layer 2 by two orders or three orders or more of magnitude.

As described above, according to the present embodiment, a semiconductor element capable of suppressing the occurrence of the current collapse can be obtained while using the semi-insulating GaN free-standing substrate.

EXAMPLES

Example 1

(Manufacture of Zn-Doped GaN Single Crystal Substrate by the Flux Method)

A GaN low-temperature buffer layer is formed to have a thickness of 30 nm at a temperature of 550° C. on a surface of a c-plane sapphire substrate having a diameter of 2 inches and a thickness of 0.43 mm, and subsequently, a GaN thin film having a thickness of 3 μm is formed by the MOCVD method at a temperature of 1050° C., thereby obtaining a MOCVD-GaN template usable as a seed substrate.

A Zn-doped GaN single crystal layer is formed by the Na flux method using the MOCVD-GaN template which has been obtained as the seed substrate.

Specifically, the MOCVD-GaN template was firstly disposed in an alumina crucible, and subsequently, the alumina crucible was filled with 30 g of metal Ga, 45 g of metal Na, 1 g of metal Zn, and 100 mg of C. The alumina crucible was put in a heating furnace and heated for approximately 100 hours with a furnace temperature of 850° C. and a furnace pressure of 4.5 MPa, and subsequently cooled to room temperature. When the alumina crucible was taken out of the furnace after finishing cooling, a brown GaN single crystal layer was deposited on the surface of the MOCVD-GaN template with a thickness of approximately 1000 μm.

The GaN single crystal layer which had been obtained in such a manner was ground with diamond abrasive grains so that the surface thereof was planarized and the nitride layer formed on a base substrate had a total thickness of 900 μm. The Flux-GaN template having the GaN single crystal layer formed on the MOCVD-GaN template was thereby obtained. When the Flux-GaN template was viewed with naked eyes, no cracking was found thereon.

Subsequently, by a laser lift-off method in which laser light was emitted from a side of the seed substrate to perform scanning at a scan speed of 30 mm/sec., the seed substrate was separated from the Flux-GaN template. Third harmonic of Nd: YAG having a wavelength of 355 nm was used as the laser light. A pulse width was set to approximately 30 ns and a pulse period was set to approximately 50 kHz. In emitting the laser light, the laser light was collected to have a circular shape with a diameter of approximately 20 μm, thereby having a light density of approximately 1.0 J/cm. The laser light was emitted while heating the Flux-GaN template from a side opposite to the seed substrate at a temperature of around 50° C.

After separating the seed substrate, a grinding processing was performed on a surface, from which the seed substrate had been detached, of a laminated structure which had been obtained, thereby obtaining a Zn-doped GaN free-standing substrate having a total thickness of 430 μm.

The crystallinity of the Zn-doped GaN substrate which had been obtained was evaluated with an X-ray rocking curve. A half-value width of (0002) plane reflection was 120 seconds and a half-value width of (10-12) plane reflection was 150 seconds, both showing favorable crystalline nature.

(Manufacture of Epitaxial Substrate by MOCVD Method)

Subsequently, an epitaxial substrate was manufactured by the MOCVD method. Specifically, a GaN layer as a buffer layer, a GaN layer as a channel layer, and an AlGaN layer as a barrier layer were laminated on the Zn-doped GaN substrate described above in this order under the following condition. In the present Example, the gas ratio of group 15 to group 13 is the ratio (molar ratio) of a supply amount of a group 15 (N) source to a supply amount of group 13 (Ga, Al) sources. The condition for forming the GaN buffer layer is a condition that it is confirmed in advance that the doping of C at a high concentration is implemented, and the condition for forming the GaN channel layer is a condition that it is confirmed in advance that the doping of C is hardly performed.

GaN buffer layer:
Formation temperature=1050° C.;
Reactor pressure=10 kPa;
Gas ratio of group 15 to group 13=500;
Thickness=1000 nm.
GaN channel layer:
Formation temperature=1050° C.;
Reactor pressure=100 kPa;
Gas ratio of group 15 to group 13=2000;
Thickness=1000 nm.
AlGaN barrier layer:
Formation temperature=1050° C.;
Reactor pressure=5 kPa;
Gas ratio of group 15 to group 13=12000;
Gas ratio of Al source gas to group 13 gas=0.25;

Thickness=25 nm.

After the formation of the layers described above, the susceptor temperature was lowered to around room temperature, and the internal gas of the reactor was returned to atmospheric pressure. Then, the epitaxial substrate which had been manufactured was taken out.

(Manufacture of HEMT Element)

Subsequently, the HEMT element 20 was manufactured using the epitaxial substrate 10. The HEMT element was designed to have a gate width of 100 μm, a source-gate distance of 1 μm, a gate-drain distance of 4 μm, and a gate length of 1 μm.

Firstly, a portion of a boundary between individual elements was removed by etching to a depth of approximately 100 nm using the photolithography process and the RIE method.

Next, a $SiO_2$ film having a thickness of 100 nm was formed on the epitaxial substrate, and then the $SiO_2$ film at locations where the source electrode and the drain electrode were to be formed was removed by etching using the photolithography process, thereby obtaining an $SiO_2$ pattern layer.

Next, a metal pattern of Ti/Al/Ni/Au (each having a film thickness of 25/200/20/100 nm) was formed at the locations where the source electrode and the drain electrode were to be formed by the vacuum deposition method and the photolithography process, thereby forming the source electrode and the drain electrode. Subsequently, a thermal treatment was performed for 30 seconds in a nitrogen gas atmosphere at a temperature of 825° C. to improve the ohmic contact of the source electrode and the drain electrode.

Then, the $SiO_2$ film at locations where the gate electrode was to be formed was removed from the $SiO_2$ pattern layer using the photolithography process.

Furthermore, a Schottky metal pattern of Ni/Au (each having a film thickness of 20/100 nm) was formed at the locations where the gate electrode was to be formed by the vacuum deposition method and the photolithography process, thereby forming the gate electrode.

The HEMT element was obtained by the processes described above.

(SIMS Evaluation of HEMT Element)

An element analysis in the depth direction was performed on the epitaxial substrate of the HEMT element, which had been obtained, by secondary ion mass spectrometry (SIMS), and each concentration of Zn and C was examined.

Figure 2:
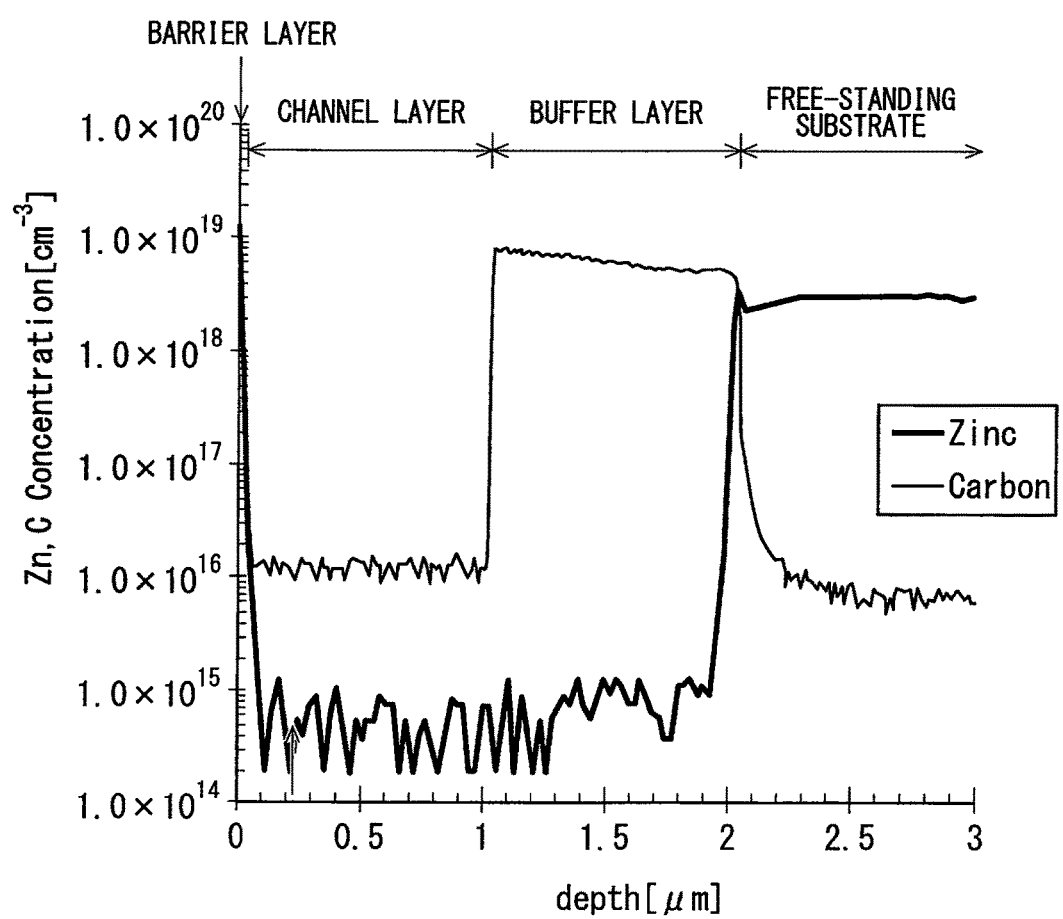
FIG. 2 is a drawing illustrating a concentration profile of elemental Zn and elemental C in an epitaxial substrate according to an Example 1.
Figure 3:
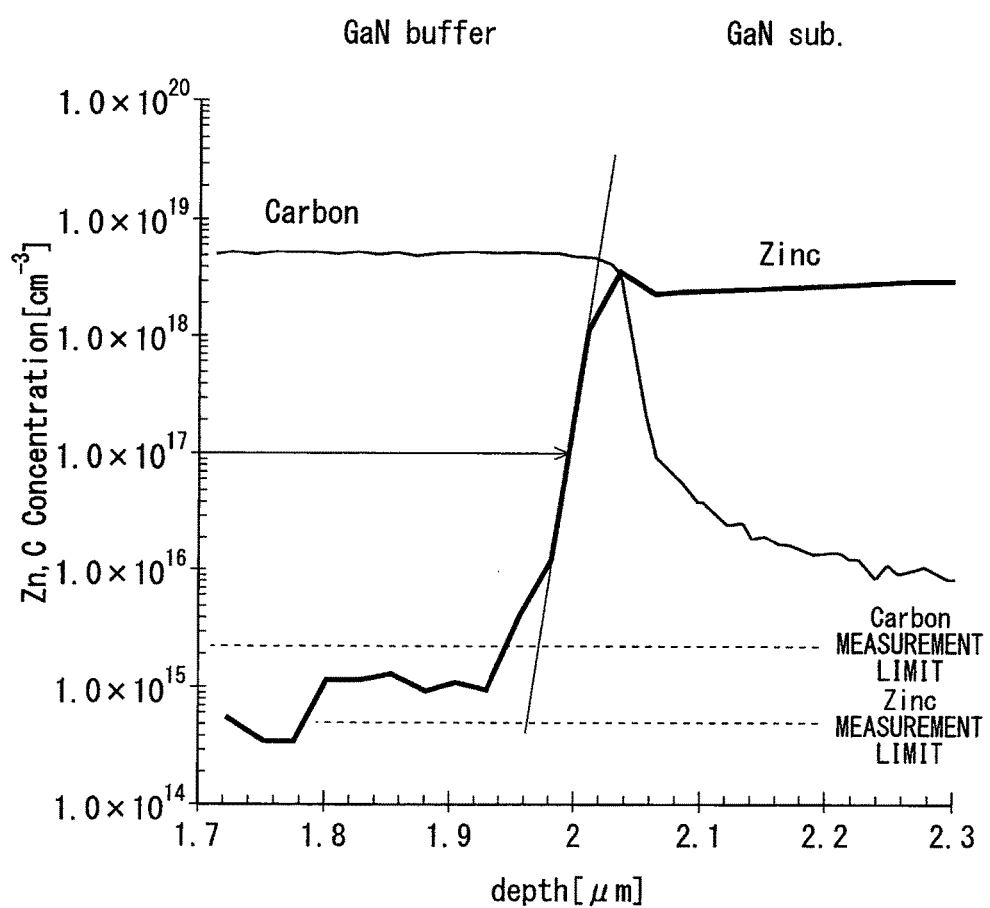
FIG. 3 is an enlarged view in a neighborhood of an interface between a GaN buffer layer and a GaN substrate in FIG. 2.

FIG. 2 is a drawing illustrating a concentration profile of Zn and C in the epitaxial substrate according to the present Example. FIG. 3 is an enlarged view in a neighborhood of an interface between the GaN buffer layer and the GaN substrate in FIG. 2. Results illustrated in FIG. 2 and FIG. 3 show the following matters.

(1) The GaN substrate is doped with Zn at a high concentration ($3 \times 10^{18}$ cm$^{-3}$).

(2) Since the concentration of C is equal to or higher than $6 \times 10^{18}$ cm$^{-3}$ in the GaN buffer layer, the GaN buffer layer includes a region which contains C at a concentration equal to or higher than $1 \times 10^{18}$ cm$^3$, and the concentration of C is equal to or lower than approximately $1 \times 10^{16}$ m$^{-3}$ in the channel layer.

(3) The concentration of Zn, which is high in a portion from the interface between the GaN buffer layer and the GaN substrate toward a side of the substrate, sharply decreases in the GaN buffer layer, and reaches to $5 \times 10^{14}$ cm$^{-3}$ which is a lower detection limit value of Zn in the measurement by the secondary ion mass spectrometry (SIMS). That is to say, the diffusion of Zn in the channel layer and the barrier layer is suppressed.

(4) A logarithm change ratio of the Zn concentration per μm (a change ratio of a common logarithm value of the concentration) in a portion where the Zn concentration is $1 \times 10^{17}$ cm$^{-3}$ is −74.9.

(Electrical Characteristics Evaluation of HEMT Element)

Drain current-drain voltage characteristics (Id–Vd characteristics) of the HEMT element were evaluated in a DC mode and a pulse mode (static drain bias Vdq=30V, static gate bias Vgq=−5V) using a semiconductor parameter analyzer. A pinch-off threshold voltage was Vg=−3V.

Adopted as an index for evaluating the current collapse was a ratio R of the drain current $Id_{pulse \cdot Vd=5V \cdot Vg=2V}$ in the pulse mode to the drain current $Id_{DC \cdot Vd=5V \cdot Vg=2V}$ in the DC mode in a case of applying the drain voltage Vd=5V and the gate voltage Vg=2V (=$Id_{pulse \cdot Vd=5V \cdot Vg=2V}/Id_{DC \cdot Vd=5V \cdot Vg=2V}$, $0 \leq R \leq 1$). The ratio R was calculated to be 0.93 in the case of the HEMT element according to the present Example. When the value R is equal to or larger than 0.7, it can be determined that the current collapse is small, thus it is determined that the current collapse is small in the HEMT element according to the present Example.

Comparative Example 1

The HEMT element was manufactured under conditions similar to that of Example 1 except that the growth condition of the GaN buffer layer was as follows, differing from Example 1. The condition for forming the GaN buffer layer is a condition that it is confirmed in advance that the amount of doped C is small compared with Example 1.

GaN Buffer Layer:
Formation temperature=1050° C.;
Reactor pressure=30 kPa;
Gas ratio of group 15 to group 13=500;
Thickness=300 nm.

The SIMS measurement was performed on the HEMT element, which had been obtained, in the manner similar to Example 1, and each concentration of Zn and C in the epitaxial substrate was examined.

FIG. 4 is a drawing illustrating a concentration profile of Zn and C in the epitaxial substrate according to the present Comparative Example. FIG. 5 is an enlarged view in a neighborhood of an interface between the C-doped GaN buffer layer and the GaN substrate in FIG. 4. Results illustrated in FIG. 4 and FIG. 5 show the following state.

(1) The GaN substrate is doped with Zn at a high concentration in the manner similar to the Example 1.

(2) The concentration of C is equal to or higher than approximately $2 \times 10^{17}$ cm$^{-3}$ at a maximum in the GaN buffer layer, that is higher than that in another regions but is lower than that in Example 1, and the concentration of C in the GaN channel layer formed under the same condition as Example 1 is approximately $4 \times 10^{16}$ cm$^{-3}$, that is higher than that in Example 1.

(3) The concentration of Zn, which is high in the portion from the interface between the GaN buffer layer and the GaN substrate toward the side of the substrate, decreases in the GaN buffer, however, the degree of reduction thereof is small compared with that in Example 1, and, even in the GaN channel layer, the concentration of Zn is equal to or higher than $5 \times 10^{16}$ cm$^{-3}$, that is higher than that of Example 1 by two orders of magnitude. That is to say, Zn is also diffused into the channel layer.

(4) A logarithm change ratio of the Zn concentration per μm (a change ratio of a common logarithm value of the concentration) in a portion where the Zn concentration is $1 \times 10^{17}$ cm$^{-3}$ is −7.3.

The value R of the HEMT element was calculated to be 0.31 under the condition similar to that of Example 1, and it was determined that the current collapse was not sufficiently suppressed in the HEMT element according to the present Comparative Example.

Examples 2 to 6, Comparative Examples 2 to 5

The HEMT elements were manufactured under the conditions similar to that of Example 1 except that the growth conditions of the GaN buffer layer (the growth temperature, the reactor pressure, the gas ratio of group 15 to group 13, and the formation thickness), for example, were variously changed. Then, the distribution in the depth direction of the Zn concentration and the C concentration in the HEMT element, which had been obtained, was obtained by the SIMS measurement, and the value R was calculated.

A list of a result thereof is shown by Table 1 together with the results of Example 1 and Comparative Example 1.

In contrast, in each case of Comparative Example 1 to Comparative Example 5 in which the HEMT element was manufactured under the condition that the concentration of C in the GaN buffer layer is lower than $1 \times 10^{18}$ cm$^{-3}$, the value R stayed at 0.51 at a maximum, and the concentration of Zn in the GaN channel layer exceeded $1 \times 10^{16}$ cm$^{-3}$ except for Comparative Example 2. This result indicates that current collapse was not suppressed in the HEMT element according to Comparative Example 1 to Comparative Example 5.

The logarithmic change ratio of the Zn concentration per μm in the portion where the Zn concentration was $1 \times 10^{17}$ cm$^{-3}$ was −8.9 in Comparative Example 1 and −7.3 in Comparative Example 2, however, in Comparative Example 3 to Comparative Example 5, the Zn concentration did not fall below $1 \times 10^{17}$ cm$^{-3}$, thus the logarithmic change ratio could not be calculated. This result indicates that in Comparative Example 1 to Comparative Example 5, a degree of reduction in the concentration of Zn is small compared with that in Example 1 to Example 6.

TABLE 1

| | Growth condition of GaN buffer layer | | | | | SIMS measurement | | |
| --- | --- | --- | --- | --- | --- | --- | --- | --- |
| | Growth temperature [° C.] | Reactor pressure [kPa] | Gas ratio of group 15 to group 13 | Thickness [nm] | Collapse evaluation Value R | C concentration in GaN buffer layer [cm$^{-3}$] | Logarithm change ratio of Zn concentration [1/μm] | Zn concentration from barrier layer/channel layer interface in downward direction by 200 nm [cm$^{-3}$] |
| Example 1 | 1050 | 10 | 500 | 1000 | 0.93 | $6 \times 10^{18}$ | −74.9 | $5 \times 10^{14}$ |
| Example 2 | 1050 | 10 | 500 | 300 | 0.91 | $6 \times 10^{18}$ | −71.3 | $6 \times 10^{14}$ |
| Example 3 | 1050 | 20 | 500 | 1000 | 0.88 | $1 \times 10^{18}$ | −20.0 | $6 \times 10^{14}$ |
| Example 4 | 1050 | 20 | 500 | 300 | 0.85 | $1 \times 10^{18}$ | −25.1 | $1 \times 10^{15}$ |
| Comparative Example 2 | 1050 | 30 | 500 | 1000 | 0.51 | $2 \times 10^{17}$ | −8.9 | $5 \times 10^{15}$ |
| Comparative Example 1 | 1050 | 30 | 500 | 300 | 0.31 | $2 \times 10^{17}$ | −7.3 | $5 \times 10^{16}$ |
| Example 5 | 1050 | 30 | 200 | 1000 | 0.90 | $1 \times 10^{19}$ | −80.5 | $6 \times 10^{14}$ |
| Comparative Example 3 | 1050 | 30 | 1000 | 1000 | 0.29 | $8 \times 10^{16}$ | Incalculable because Zn concentration is not equal to or lower than $1 \times 10^{17}$ cm$^{-3}$ | $2 \times 10^{17}$ |
| Comparative Example 4 | 1050 | 30 | 2000 | 1000 | 0.21 | $4 \times 10^{16}$ | Incalculable because Zn concentration is not equal to or lower than $1 \times 10^{17}$ cm$^{-3}$ | $3 \times 10^{17}$ |
| Example 6 | 950 | 30 | 500 | 1000 | 0.85 | $1 \times 10^{18}$ | −34.9 | $7 \times 10^{14}$ |
| Comparative Example 5 | 1150 | 30 | 500 | 1000 | 0.25 | $4 \times 10^{16}$ | Incalculable because Zn concentration is not equal to or lower than $1 \times 10^{17}$ cm$^{-3}$ | $4 \times 10^{17}$ |

As shown in Table 1, in each case of Example 1 to Example 6 in which the HEMT element was manufactured under the condition that the concentration of C in the GaN buffer layer was equal to or higher than $1 \times 10^{18}$ cm$^{-3}$, the value R was equal to or larger than 0.85, and the concentration of Zn in the GaN channel layer was equal to or lower than $1 \times 10^{15}$ cm$^{-3}$. This result indicates that the HEMT element in which current collapse was suppressed was obtained in all of Example 1 to Example 6.

A logarithmic change ratio of the Zn concentration per μm in a portion where the Zn concentration was $1 \times 10^{17}$ cm$^{-3}$ was −20.0 or less. This indicates that the concentration of Zn drastically decreases in all of the Example 1 to Example 6.

Example 7

In the HEMT element according to Example 1 to Example 6, the concentration of Zn sharply decreases, thus the concentration of Zn in the channel layer falls below $1 \times 10^{16}$ cm$^{-3}$ and the current collapse is thereby suppressed, however, as long as the concentration of Zn sufficiently falls below $1 \times 10^{16}$ cm$^{-3}$ at the neighborhood of the interface (the hetero interface) between the barrier layer and the channel layer in the channel layer, the current collapse may be suppressed in some cases even if the degree of reduction in the Zn concentration is small.

In the present Example, the epitaxial substrate 10 and further the HEMT element 20 were manufactured under the condition similar to that of Example 1 except that the growth conditions of the buffer layer 2 and the channel layer 3 were as follows, differing from Example 1.
GaN Buffer Layer:
Formation temperature=1050° C.;
Reactor pressure=10 kPa;
Gas ratio of group 15 to group 13=500;
Thickness=100 nm.
GaN Channel Layer:
Formation temperature=1050° C.;
Reactor pressure=100 kPa;
Gas ratio of group 15 to group 13=2000;
Thickness=1000 nm.

FIG. 6 is a drawing illustrating a concentration profile of Zn and C from the surface (upper surface) of the barrier layer 4 in the depth direction obtained by performing the measurement on the HEMT element, which has been obtained, in the depth direction by the SIMS measurement under conditions similar to that of the Example 1. The result illustrated in FIG. 6 shows the following state.

(1) The GaN substrate is doped with Zn at a high concentration.

(2) Since the concentration of C is $3 \times 10^{18}$ cm$^{-3}$ in the buffer layer at a maximum, the buffer layer includes a region which contains C at a concentration equal to or higher than $1 \times 10^{18}$ cm$^{-3}$, and the concentration of C is equal to or lower than approximately $2 \times 10^{16}$ cm$^{-3}$ in the channel layer. The concentration of C is sharply changed at the interface between the buffer layer and the channel layer, but is slowly changed in a portion from the buffer layer toward the GaN substrate. FIG. 6 shows an increase in the concentration of C in a neighborhood of the barrier layer toward the barrier layer. It is caused by knock-on of elements adhered to a sample surface.

(3) The concentration of Zn, which is high in a portion from the interface between the buffer layer and the GaN substrate toward a side of the substrate, sharply decreases in the buffer layer, further decreases in the channel layer, and reaches to $5 \times 10^{14}$ cm$^{-3}$, which is the lower detection limit value of Zn in the SIMS measurement, in a region including the neighborhood of the interface (hetero interface) between the barrier layer and the channel layer. That is to say, the diffusion of Zn is suppressed.

(4) A logarithmic change ratio of the Zn concentration per µm (a change ratio of a common logarithm value of the concentration) in a portion where the Zn concentration is $1 \times 10^{17}$ cm$^{-3}$ is −15.0.

The value R of the HEMT element described above was calculated to be 0.88. That is to say, it is determined that the current collapse is preferably suppressed also in the HEMT element according to the present Example.

Example 8

The epitaxial substrate 10 and further the HEMT element 20 were manufactured under conditions similar to that of Example 1 except that the growth condition of the buffer layer 2 and the channel layer 3 were as follows, differing from Example 1. In the formation of the buffer layer 2 in the above processing, the formation condition is set in two stages of a first condition and a second condition, and is switched from the first condition to the second condition halfway through the formation. This is intended to form the buffer layer 2 as a multi-layered buffer layer in which the GaN layer is laminated on the $Al_aGa_{1-a}N$ layer ($0<a\leq 1$) or the composition gradient buffer layer in which the existence ratio of Al and Ga is different in the thickness direction. Herein, the first condition is a condition that the doping of C into the buffer layer 2 is not actively performed, and the second condition is a condition that the doping of C into the buffer layer 2 is confirmed. The total thickness of the buffer layer 2 was set to 110 nm.
Buffer Layer (First Condition):
Formation temperature=1050° C.;
Reactor pressure=5 kPa;
Group 13 source gas=Al source and Ga source;
Gas ratio of group 15 to group 13=2000;
Gas ratio of Al source gas to group 13 source gas=0.03;
Growth rate=1 nm/sec.;
Growth time=10 seconds.
Buffer Layer (Second Condition):
Formation temperature=1050° C.;
Reactor pressure=10 kPa;
Group 13 source gas=Ga source;
Gas ratio of group 15 to group 13=500;
Growth rate=1 nm/sec.;
Growth time=100 seconds.
GaN Channel Layer:
Formation temperature=1050° C.;
Reactor pressure=100 kPa;
Gas ratio of group 15 to group 13=2000;
Thickness=900 nm.

Figure 7:
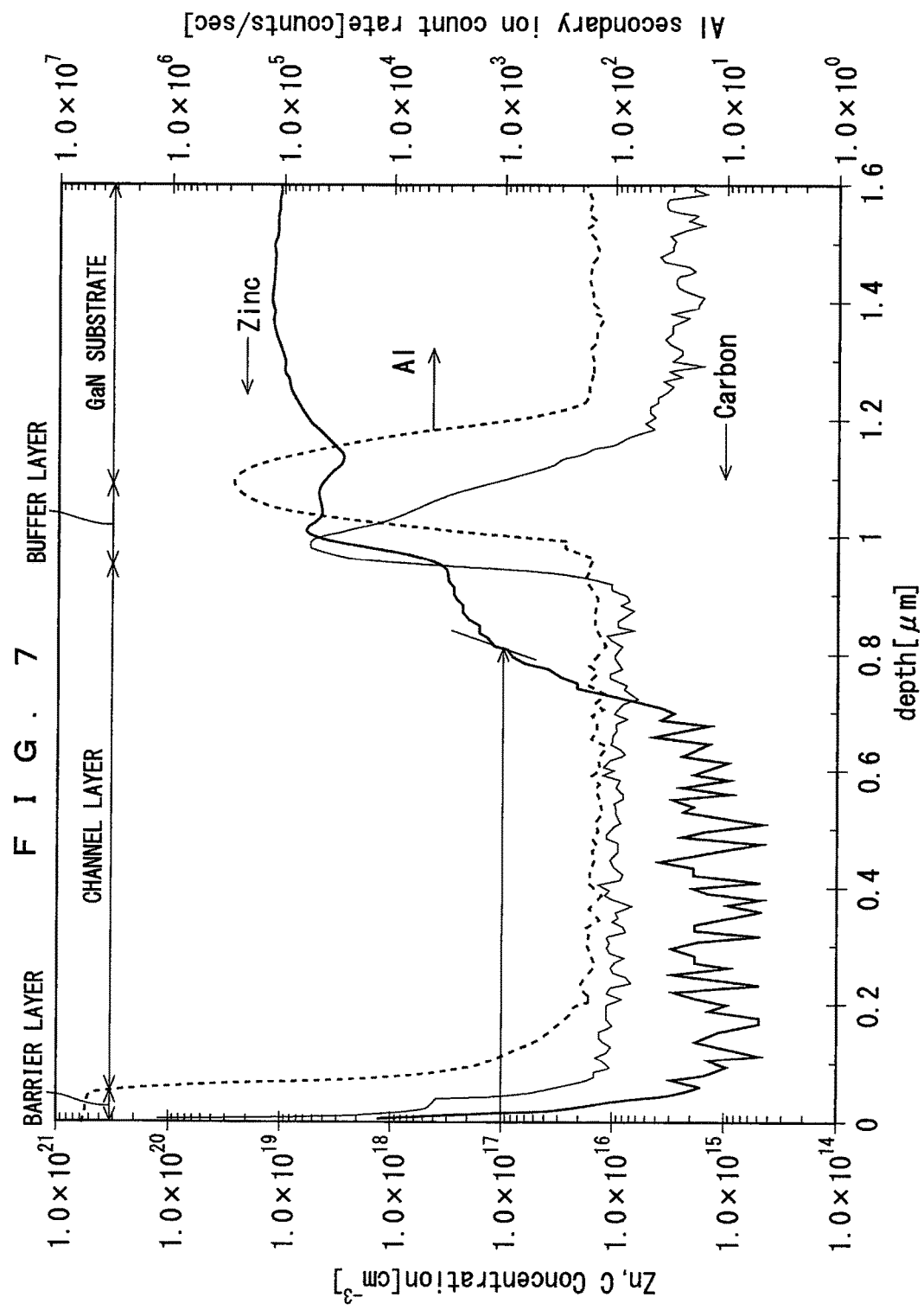
FIG. 7 is a drawing illustrating a concentration profile of elemental Zn and elemental C from a surface of a barrier layer 4 in a depth direction and a secondary ion signal profile of elemental Al in an Example 8.

FIG. 7 is a drawing illustrating a concentration profile of Zn and C from the surface (upper surface) of the barrier layer 4 in the depth direction obtained by performing the measurement on the HEMT element, which has been obtained, in the depth direction by the SIMS measurement under conditions similar to that of Example 1 and a secondary ion signal profile of Al in the depth direction (a distribution of a secondary ion count rate of Al in the depth direction). The result illustrated in FIG. 7 shows the following state.

(1) The GaN substrate is doped with Zn at a high concentration.

(2) The buffer layer includes a region which contains C at a concentration equal to or higher than $1 \times 10^{18}$ cm$^{-3}$, $6 \times 10^{18}$ cm$^{-3}$ at a maximum, and the concentration of C is equal to or lower than approximately $1 \times 10^{16}$ cm$^{-3}$ in the channel layer. The concentration of C is sharply changed at the interface between the buffer layer and the channel layer, but is gradually changed in the portion from the buffer layer toward the GaN substrate. FIG. 7 shows increase in the concentration of C in the neighborhood of the barrier layer in the channel layer toward the barrier layer. It is caused by knock-on of elements adhered to a sample surface.

(3) The concentration of Zn, which is high in a portion from the interface between the buffer layer and the GaN substrate toward a side of the substrate, sharply decreases in the buffer layer, further decreases in the channel layer, and reaches to $5 \times 10^{14}$ cm$^{-3}$, which is the lower detection limit value of Zn in the SIMS measurement, in the region including the neighborhood of the interface (hetero interface) between the barrier layer and the channel layer. That is to say, the diffusion of Zn is suppressed.

(4) A logarithmic change ratio of the Zn concentration per µm (a change ratio of a common logarithm value of the concentration) in a portion where the Zn concentration is $1 \times 10^{17}$ cm$^{-3}$ is −13.0.

(5) Al is contained in a range wider than 110 nm which is a targeted thickness of the whole buffer layer, and the range also includes part of the GaN substrate.

(6) Since Al is hardly detected in the region where the concentration of C reaches a maximum in the buffer layer, it is deemed that the buffer layer includes the GaN layer which is significantly doped with C and the AlGaN layer which is slightly doped with C.

The value R of the HEMT element described above was calculated to be 0.90. That is to say, it was determined that current collapse was preferably suppressed also in the HEMT element according to the present Example.

Example 9

The HENT element 20 was manufactured under conditions similar to that of Example 8 except that the growth condition of the buffer layer 2 and the channel layer 3 was as follows, differing from Example 8. That is to say, also in the present Example, in the formation of the buffer layer 2, the formation conditions are set in two stages of a first condition and a second condition, and is switched from the first condition to the second condition halfway through the formation. The total thickness of the buffer layer 2 was set to 350 nm.

Buffer Layer (First Condition):
Formation temperature=1050° C.;
Reactor pressure=5 kPa;
Group 13 source gas=Al source and Ga source;
Gas ratio of group 15 to group 13=2000;
Gas ratio of Al source gas to group 13 source gas=0.01;
Growth rate=1 nm/sec.;
Growth time=50 seconds.
Buffer Layer (Second Condition):
Formation temperature=1050° C.;
Reactor pressure=10 kPa;
Gas ratio of group 15 to group 13=500;
Growth rate=1 nm/sec.;
Growth time=300 seconds.
GaN Channel Layer:
Formation temperature=1050° C.;
Reactor pressure=100 kPa;
Gas ratio of group 15 to group 13=2000;
Thickness=1700 nm.

The concentration profile of Zn and C from the surface (upper surface) of the barrier layer 4 in the depth direction obtained by performing the SIMS measurement on the HEMT element, which has been obtained, under conditions similar to that of Example 1 and a secondary ion signal profile of Al in the depth direction show the following matters.

(1) The GaN substrate is doped with Zn at a high concentration ($1\times10^{19}$ cm$^{-3}$).

(2) The buffer layer includes a region which contains C at a concentration equal to or higher than $1\times10^{18}$ cm$^{-3}$, $6\times10^{18}$ cm$^{-3}$ at a maximum, and the concentration of C is equal to or lower than approximately $1\times10^{16}$ cm$^{-3}$ in the channel layer. The concentration of C is sharply changed at the interface between the buffer layer and the channel layer, but is gradually changed in the portion from the buffer layer toward the GaN substrate.

(3) The concentration of Zn, which is high in the portion from the interface between the buffer layer and the GaN substrate toward the side of the substrate, sharply decreases in the buffer layer, further decreases in the channel layer, and reaches to $5\times10^{14}$ cm$^{-3}$, which is the lower detection limit value of Zn in the SIMS measurement, at the neighborhood of the interface (hetero interface) between the barrier layer and the channel layer in the channel layer. That is to say, the diffusion of Zn is suppressed.

(4) A logarithmic change ratio of the Zn concentration per µm (a change ratio of a common logarithm value of the concentration) in a portion where the Zn concentration is $1\times10^{17}$ cm$^{-3}$ is −58.3.

(5) Al is contained in a range wider than 350 nm which is a targeted thickness of the whole buffer layer, and the range also includes part of the GaN substrate.

(6) Since Al is hardly detected in a region where the concentration of C reaches a maximum in the buffer layer, it is deemed that the buffer layer includes the GaN layer which is significantly doped with C and the AlGaN layer which is slightly doped with C.

The value R of the HEMT element described above was calculated to be 0.92. That is to say, it is determined that current collapse is preferably suppressed also in the HEMT element according to the present Example.

What is claimed is:

1. An epitaxial substrate for semiconductor elements, comprising:
    a semi-insulating free-standing substrate formed of GaN doped with Zn;
    a buffer layer adjacent to said free-standing substrate and comprising a group 13 nitride layer that is doped with C at a concentration equal to or higher than $1\times10^{18}$ cm$^{-3}$ in at least part thereof in a thickness direction;
    a channel layer adjacent to said buffer layer; and
    a barrier layer on an opposite side of said buffer layer with said channel layer provided therebetween, wherein
    said buffer layer is a diffusion suppressing layer that suppresses the diffusion of Zn from said free-standing substrate into said channel layer, and
    a concentration of Zn in said channel layer is equal to or lower than $1\times10^{16}$ cm$^{-3}$.

2. The epitaxial substrate for the semiconductor elements according to claim 1, wherein
    said group 13 nitride layer is a GaN layer.

3. The epitaxial substrate for the semiconductor elements according to claim 1, wherein
    said group 13 nitride layer is either of
    a multi-layered buffer layer, which is formed by laminating two or more group 13 nitride layers having different compositions, at least one of said two or more group 13 nitride layers doped with C at a concentration of $1\times10^{18}$ cm$^{-3}$ or more, or
    a composition gradient buffer layer formed of group 13 nitride containing two or more group 13 elements each having an existence ratio changed in a thickness direction.

4. The epitaxial substrate for the semiconductor elements according to claim 1, wherein
    said channel layer is formed of GaN, and said barrier layer is formed of AlGaN.

5. A semiconductor element, comprising:
    a semi-insulating free-standing substrate formed of GaN doped with Zn;
    a buffer layer adjacent to said free-standing substrate and comprising a group 13 nitride layer that is doped with C at a concentration equal to or higher than $1\times10^{18}$ cm$^{-3}$ in at least part thereof in a thickness direction;
    a channel layer adjacent to said buffer layer;
    a barrier layer provided on an opposite side of said buffer layer with said channel layer provided therebetween; and
    a gate electrode, a source electrode, and a drain electrode provided on said barrier layer, wherein said buffer layer is a diffusion suppressing layer that suppresses the diffusion of Zn from said free-standing substrate into said channel layer, and a concentration of Zn in said channel layer is equal to or lower than $1\times10^{16}$ cm$^{-3}$.

6. The semiconductor element according to claim 5, wherein
said group 13 nitride layer is a GaN layer.

7. The semiconductor element according to claim 5, wherein
said group 13 nitride layer is either of
a multi-layered buffer layer, which is formed by laminating two or more group 13 nitride layers having different compositions, at least one of said two or more group 13 nitride layers doped with C at a concentration of $1\times10^{18}$ cm$^{-3}$ or more, or
a composition gradient buffer layer formed of group 13 nitride containing two or more group 13 elements each having an existence ratio changed in a thickness direction.

8. The semiconductor element according to claim 5, wherein
said channel layer is formed of GaN, and said barrier layer is formed of AlGaN.

9. A method of manufacturing an epitaxial substrate for semiconductor elements, comprising:
a) a preparation step of preparing a semi-insulating free-standing substrate formed of GaN doped with Zn;
b) a buffer layer formation step of forming a buffer layer adjacent to said free-standing substrate;
c) a channel layer formation step of forming a channel layer adjacent to said buffer layer; and
d) a barrier layer formation step of forming a barrier layer in a position opposite to said buffer layer with said channel layer provided therebetween, wherein
in said buffer layer formation step, said buffer layer is formed as a diffusion suppressing layer, which is a group 13 nitride layer that is doped with C at a concentration equal to or higher than $1\times10^{18}$ cm$^{-3}$ in at least a part thereof in a thickness direction, that suppresses the diffusion of Zn from said free-standing substrate into said channel layer, so that a concentration of Zn in said channel layer is equal to or lower than $1\times10^{16}$ cm$^{-3}$.

10. The method of manufacturing the epitaxial substrate for the semiconductor elements according to claim 9, wherein
said group 13 nitride layer is formed of GaN.

11. The method of manufacturing the epitaxial substrate for the semiconductor elements according to claim 9, wherein
said group 13 nitride layer is formed as either of
a multi-layered buffer layer by laminating two or more group 13 nitride layers having different compositions, at least one of said two or more group 13 nitride layers doped with C at a concentration of $1\times10^{18}$ cm$^{-3}$ or more, or
a composition gradient buffer layer formed of group 13 nitride containing two or more group 13 elements each having an existence ratio changed in a thickness direction.

12. The method of manufacturing the epitaxial substrate for the semiconductor elements according to claim 9, wherein
said channel layer is formed of GaN, and said barrier layer is formed of AlGaN.

13. The method of manufacturing the epitaxial substrate for the semiconductor elements according to claim 9, wherein
said free-standing substrate is manufactured by a flux method.

14. The epitaxial substrate for the semiconductor elements according to claim 2, wherein
said channel layer is formed of GaN, and said barrier layer is formed of AlGaN.

15. The epitaxial substrate for the semiconductor elements according to claim 3, wherein
said channel layer is formed of GaN, and said barrier layer is formed of AlGaN.

16. The semiconductor element according to claim 6, wherein
said channel layer is formed of GaN, and said barrier layer is formed of AlGaN.

17. The semiconductor element according to claim 7, wherein
said channel layer is formed of GaN, and said barrier layer is formed of AlGaN.

18. The method of manufacturing the epitaxial substrate for the semiconductor elements according to claim 10, wherein
said free-standing substrate is manufactured by a flux method.

19. The method of manufacturing the epitaxial substrate for the semiconductor elements according to claim 11, wherein
said free-standing substrate is manufactured by a flux method.

20. The method of manufacturing the epitaxial substrate for the semiconductor elements according to claim 12, wherein
said free-standing substrate is manufactured by a flux method.

* * * * *

UNITED STATES PATENT AND TRADEMARK OFFICE
CERTIFICATE OF CORRECTION

PATENT NO. : 10,410,859 B2
APPLICATION NO. : 15/965014
DATED : September 10, 2019
INVENTOR(S) : Mikiya Ichimura et al.

Page 1 of 1

It is certified that error appears in the above-identified patent and that said Letters Patent is hereby corrected as shown below:

On the Title Page

Change:
"(72) Inventors: Mikiya Ichimura, Ichinomiya (JP);
Sota Maehara, Nagoya (JP); Yoshitaka
Kuraoka, Okazaki (JP)"

To:
---(72) Inventors: Mikiya Ichimura, Ichinomiya-shi, Aichi (JP);
Sota Maehara, Nagoya-shi, Aichi (JP);
Yoshitaka Kuraoka, Okazaki-shi, Aichi (JP)---

Signed and Sealed this
Nineteenth Day of November, 2019

Andrei Iancu
*Director of the United States Patent and Trademark Office*